United States Patent
Sipani et al.

(10) Patent No.: US 8,937,018 B2
(45) Date of Patent: Jan. 20, 2015

(54) METHODS OF FORMING A PATTERN ON A SUBSTRATE

(71) Applicant: Micron Technology, Inc., Boise, ID (US)

(72) Inventors: Vishal Sipani, Boise, ID (US); Anton J. deVillers, Clifton Park, NY (US); Ranjan Khurana, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/786,848

(22) Filed: Mar. 6, 2013

(65) Prior Publication Data

US 2014/0256140 A1 Sep. 11, 2014

(51) Int. Cl.
*H01L 21/311* (2006.01)
*H01L 21/308* (2006.01)

(52) U.S. Cl.
CPC .................. *H01L 21/3086* (2013.01)
USPC ...................................................... 438/703

(58) Field of Classification Search
CPC ............ H01L 21/0337; H01L 21/0338; H01L 21/0273; H01L 21/3088; H01L 21/3086; H01L 21/31144; H01L 21/32139; H01L 21/76816; H01L 21/461; H01L 21/76229; H01L 45/1683; H01L 45/1691; H01L 21/302; H01L 21/308; H01L 21/31; H01L 21/311
USPC ................... 438/696, 703, 761, 800
See application file for complete search history.

(56) References Cited

U.S. PATENT DOCUMENTS

| | | | |
|---|---|---|---|
| 5,824,587 A * | 10/1998 | Krivokapic | 438/300 |
| 6,403,431 B1 * | 6/2002 | Chung et al. | 438/296 |
| 6,521,543 B2 * | 2/2003 | Lien | 438/717 |
| 7,175,944 B2 | 2/2007 | Yin et al. | |
| 7,786,015 B2 | 8/2010 | Chen et al. | |
| 7,790,360 B2 | 9/2010 | Alapati et al. | |
| 7,820,553 B2 | 10/2010 | Chu et al. | |
| 7,915,171 B2 | 3/2011 | Wallace et al. | |
| 7,981,736 B2 | 7/2011 | Juengling | |
| 8,026,172 B2 | 9/2011 | Wang et al. | |
| 8,039,399 B2 | 10/2011 | Niroomand et al. | |
| 8,080,443 B2 | 12/2011 | Chen et al. | |

(Continued)

FOREIGN PATENT DOCUMENTS

WO WO 2009126491 A1 * 10/2009

OTHER PUBLICATIONS

U.S. Appl. No. 13/355,407, filed Jan. 20, 2012, Doebler.

(Continued)

*Primary Examiner* — Zandra Smith
*Assistant Examiner* — Sophia Nguyen
(74) *Attorney, Agent, or Firm* — Wells St. John, P.S.

(57) ABSTRACT

A method of forming a pattern on a substrate includes forming spaced, upwardly-open, cylinder-like structures projecting longitudinally outward of a base. Photoresist is formed elevationally over and laterally inward of the cylinder-like structures. The photoresist is patterned to form interstitial spaces into the photoresist laterally outward of the cylinder-like structures. The interstitial spaces are individually surrounded by at least three of the cylinder-like structures. The patterned photoresist is used as an etch mask while etching interstitial openings into the base and while the photoresist is laterally inward of the cylinder-like structures. Other aspects are disclosed.

27 Claims, 13 Drawing Sheets

(56) References Cited

U.S. PATENT DOCUMENTS

| | | | |
|---|---|---|---|
| 8,211,803 B2 | 7/2012 | Sandhu et al. | |
| 8,266,558 B2 | 9/2012 | Wells | |
| 2006/0011947 A1* | 1/2006 | Juengling | 257/202 |
| 2006/0134448 A1 | 6/2006 | Daniel et al. | |
| 2006/0231900 A1* | 10/2006 | Lee et al. | 257/368 |
| 2007/0281219 A1* | 12/2007 | Sandhu | 430/5 |
| 2008/0012056 A1* | 1/2008 | Gonzalez | 257/296 |
| 2008/0113483 A1* | 5/2008 | Wells | 438/424 |
| 2008/0254637 A1 | 10/2008 | Hanson et al. | |
| 2008/0280444 A1* | 11/2008 | Jung | 438/694 |
| 2009/0068842 A1* | 3/2009 | Kim | 438/694 |
| 2009/0166723 A1 | 7/2009 | Sung et al. | |
| 2010/0167520 A1 | 7/2010 | Chen et al. | |
| 2010/0170868 A1 | 7/2010 | Lin et al. | |
| 2010/0216307 A1 | 8/2010 | Niroomand et al. | |
| 2010/0221919 A1* | 9/2010 | Lee et al. | 438/694 |
| 2010/0240221 A1 | 9/2010 | Kim et al. | |
| 2010/0258966 A1 | 10/2010 | Sandhu | |
| 2011/0117719 A1 | 5/2011 | Brown et al. | |
| 2011/0129991 A1* | 6/2011 | Armstrong et al. | 438/585 |
| 2011/0163420 A1 | 7/2011 | Valdivia et al. | |
| 2011/0183269 A1 | 7/2011 | Zhu | |
| 2011/0312184 A1* | 12/2011 | Lee et al. | 438/696 |
| 2012/0028476 A1* | 2/2012 | Li et al. | 438/780 |
| 2012/0273131 A1 | 11/2012 | Wells | |
| 2012/0312151 A1* | 12/2012 | Patel | 89/36.02 |
| 2014/0162457 A1* | 6/2014 | Sipani et al. | 438/696 |
| 2014/0162458 A1* | 6/2014 | Khurana et al. | 438/696 |
| 2014/0162459 A1* | 6/2014 | Trapp et al. | 438/696 |

OTHER PUBLICATIONS

U.S. Appl. No. 13/712,806, filed Dec. 12, 2012, Sipani et al.
U.S. Appl. No. 13/712,820, filed Dec. 12, 2012, Khurana et al.
U.S. Appl. No. 13/712,830, filed Dec. 12, 2012, Trapp et al.
Chapter 2: Crystal Structures and Symmetry; Laue, B; Dec. 28, 2001; 4pp.

* cited by examiner

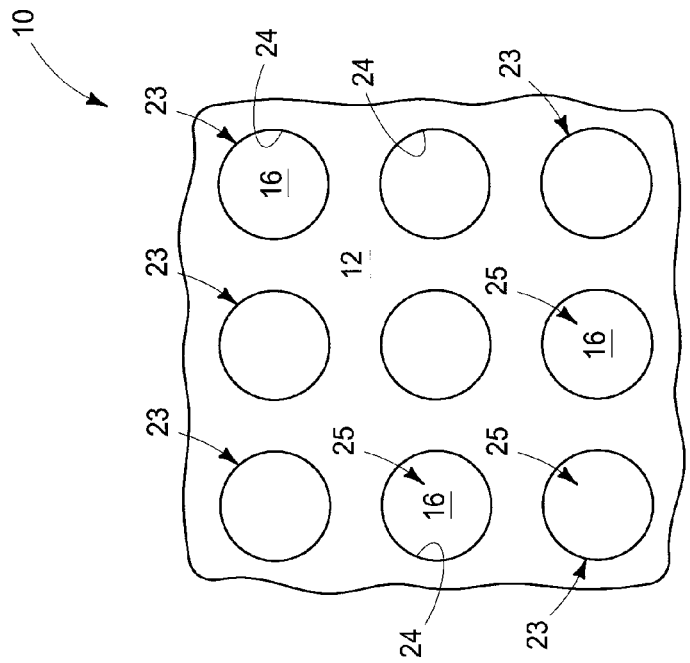
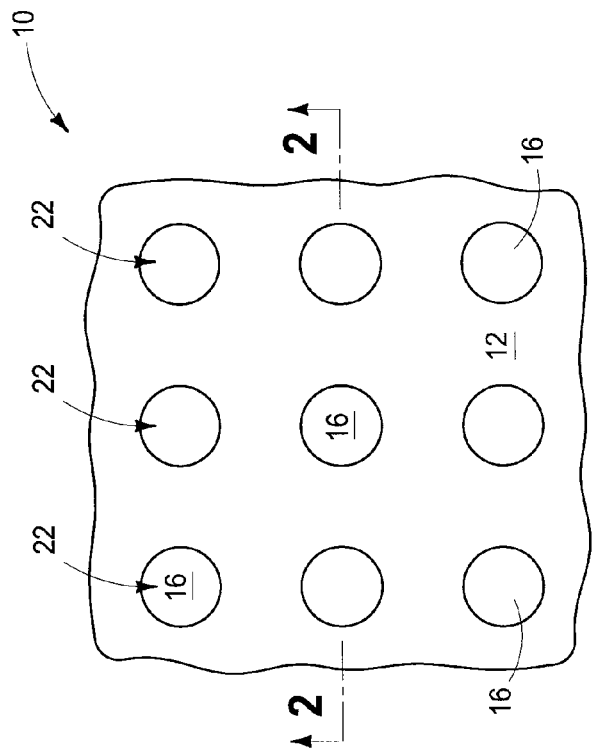
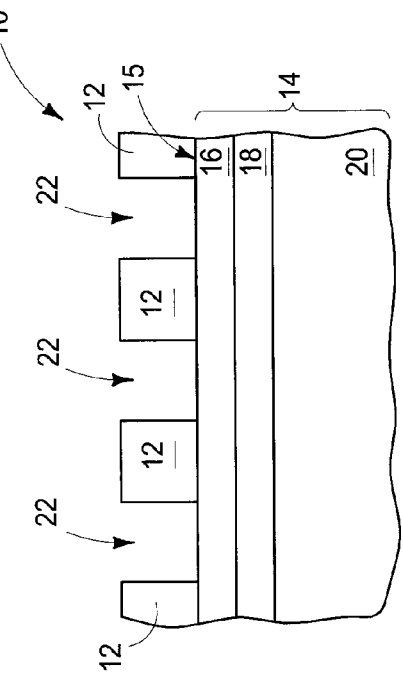

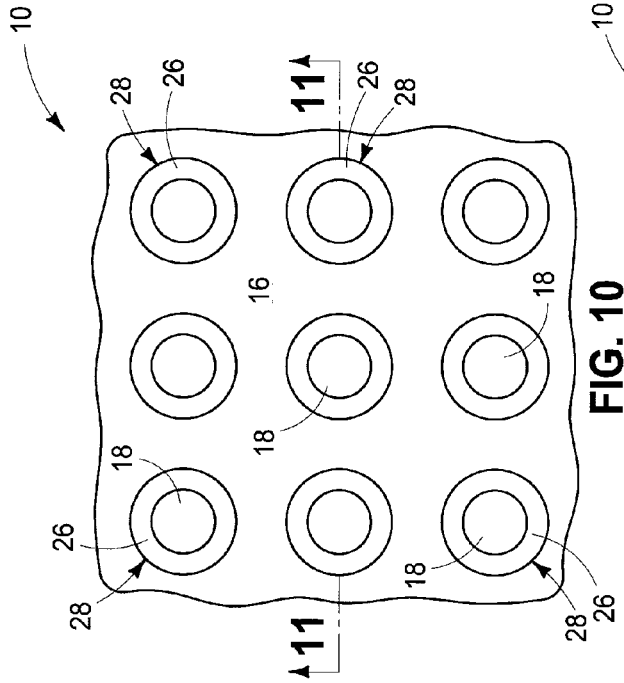
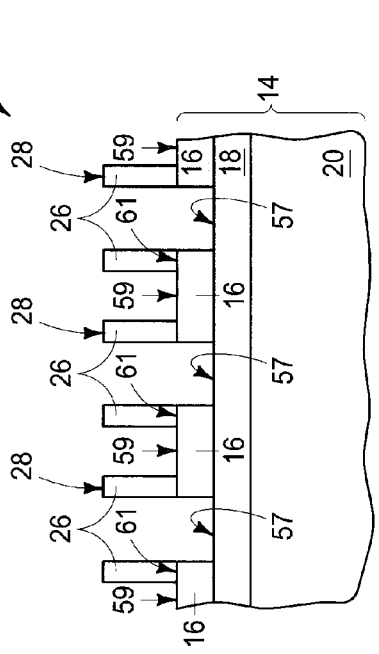
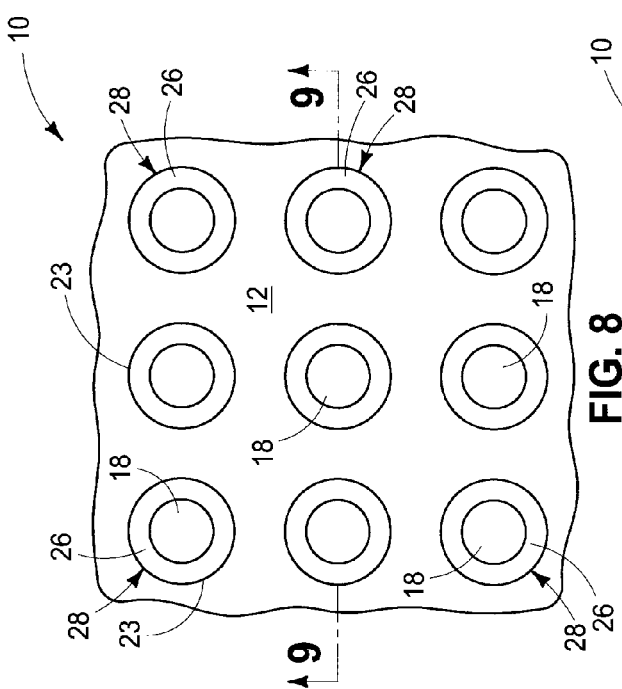

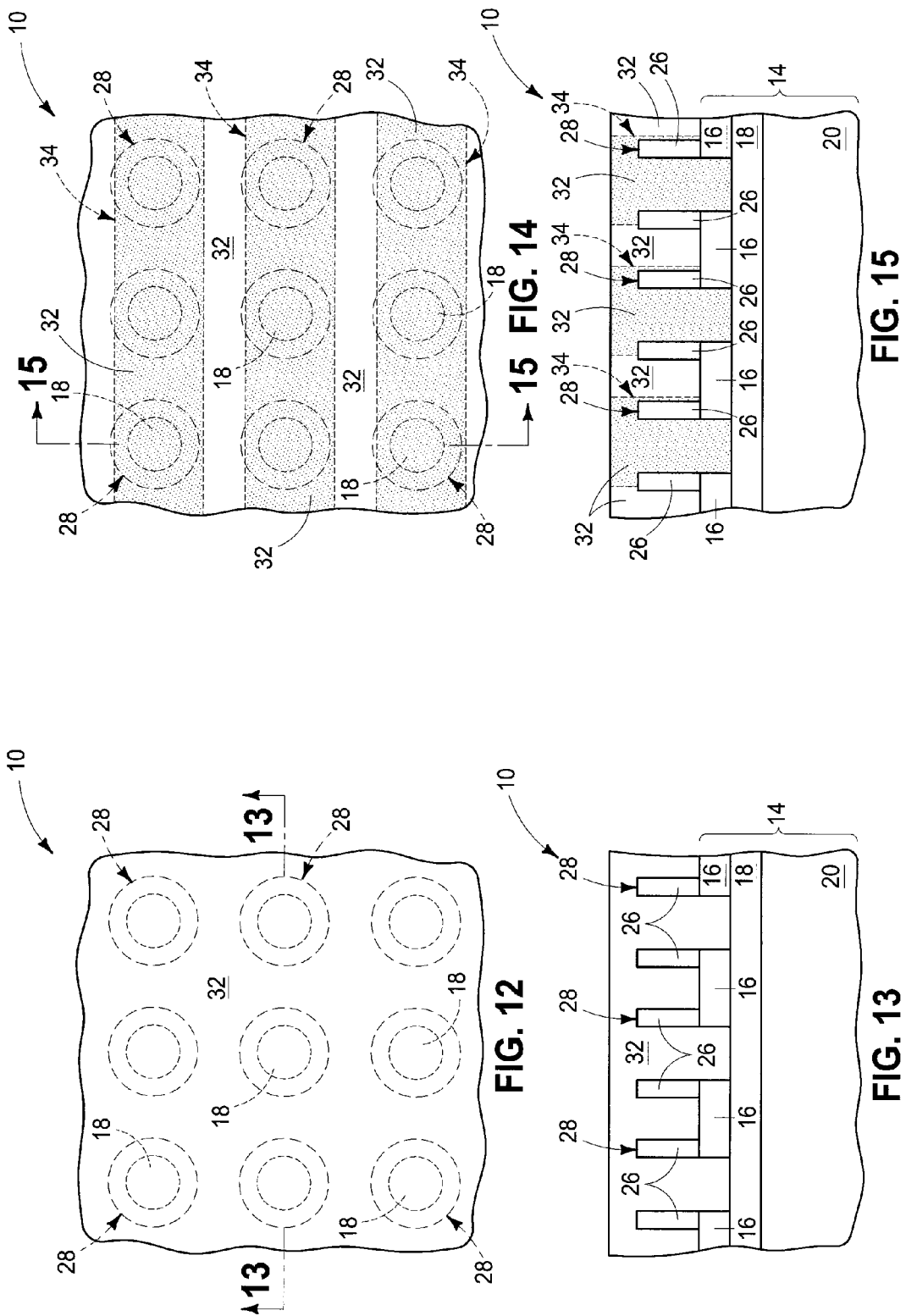

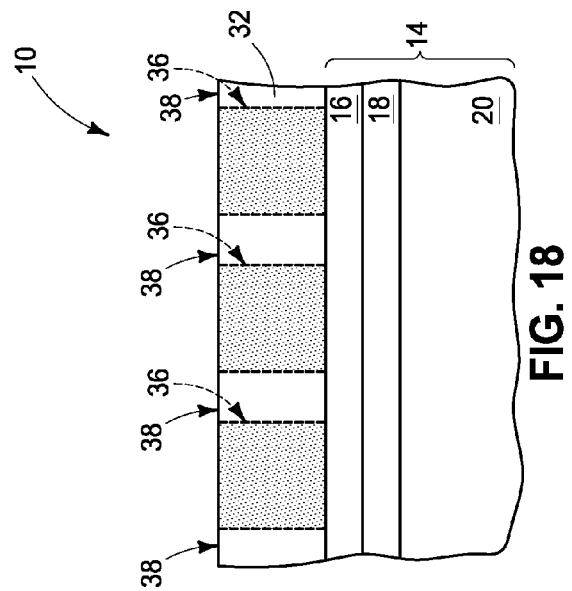
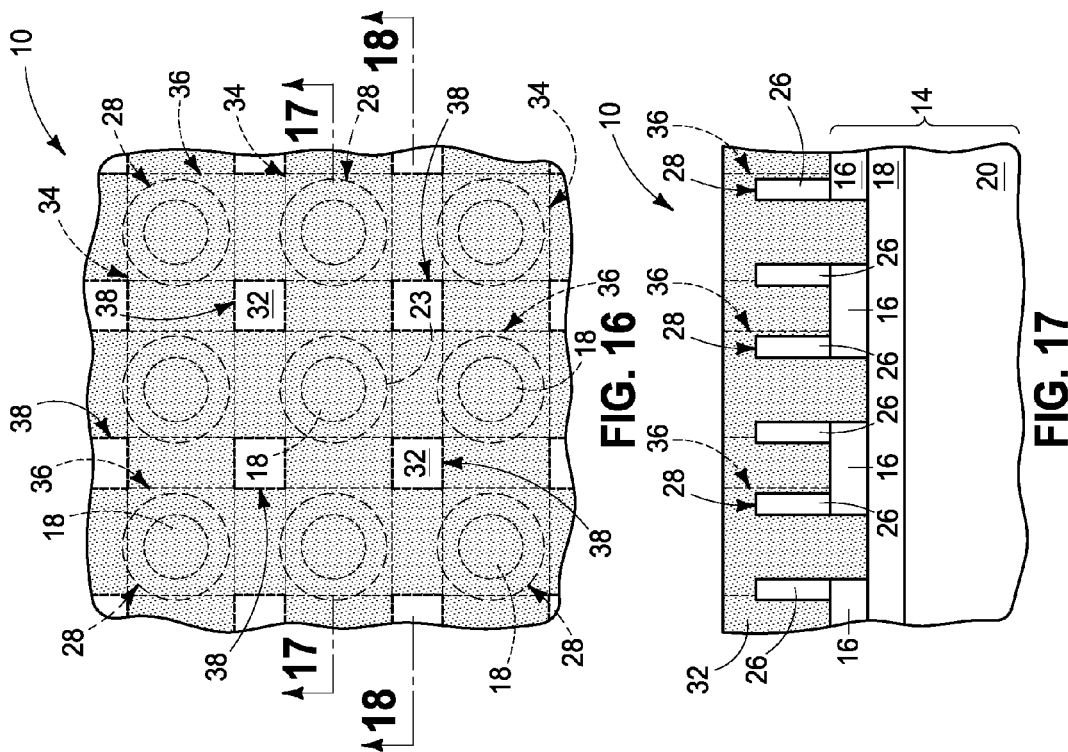
FIG. 16
FIG. 17
FIG. 18

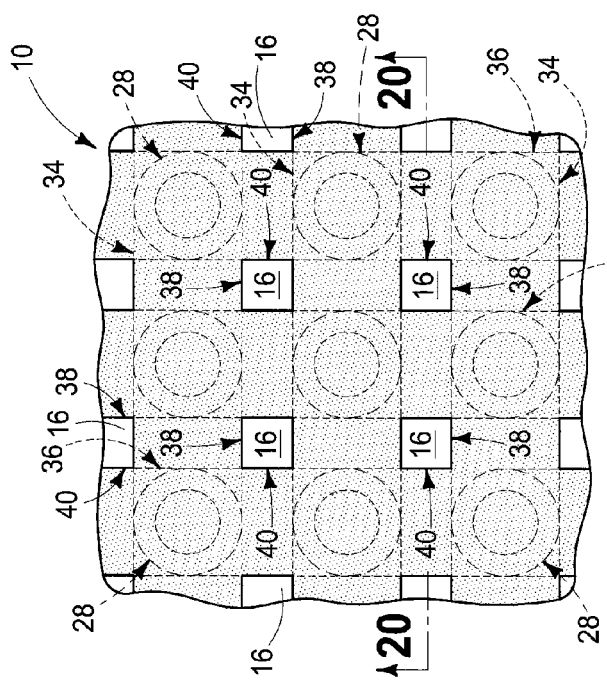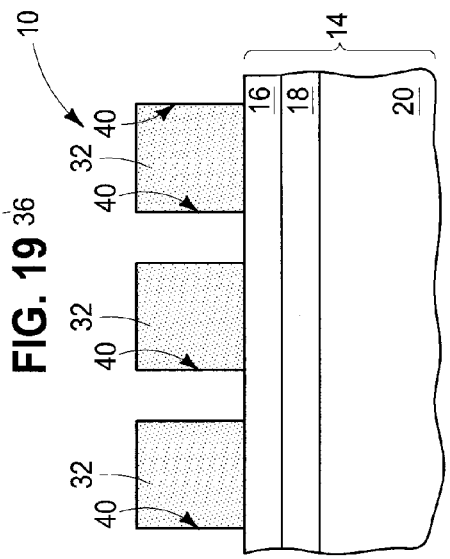
FIG. 19  FIG. 20
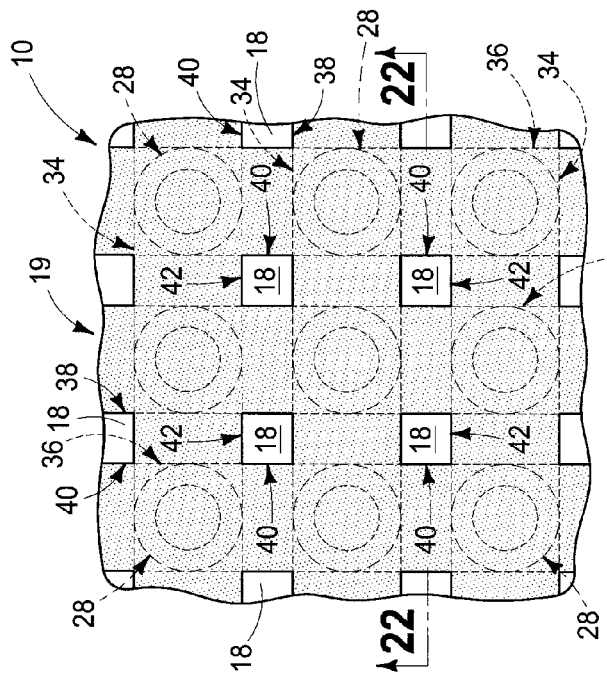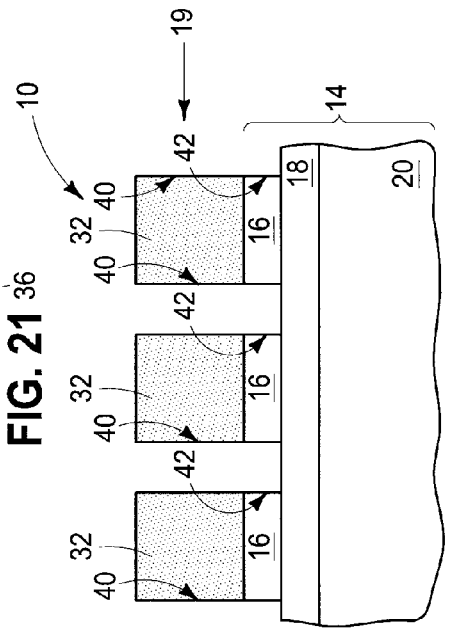
FIG. 21  FIG. 22

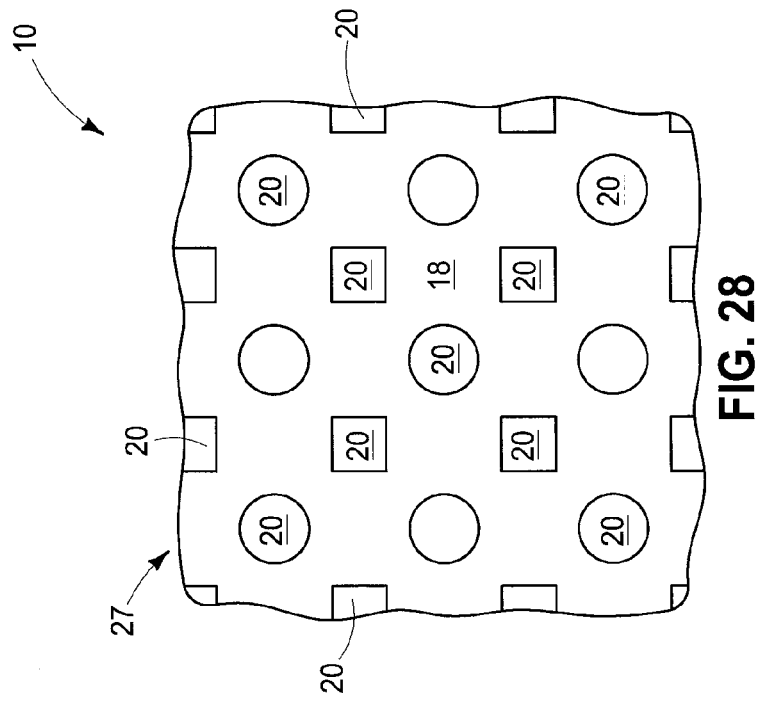
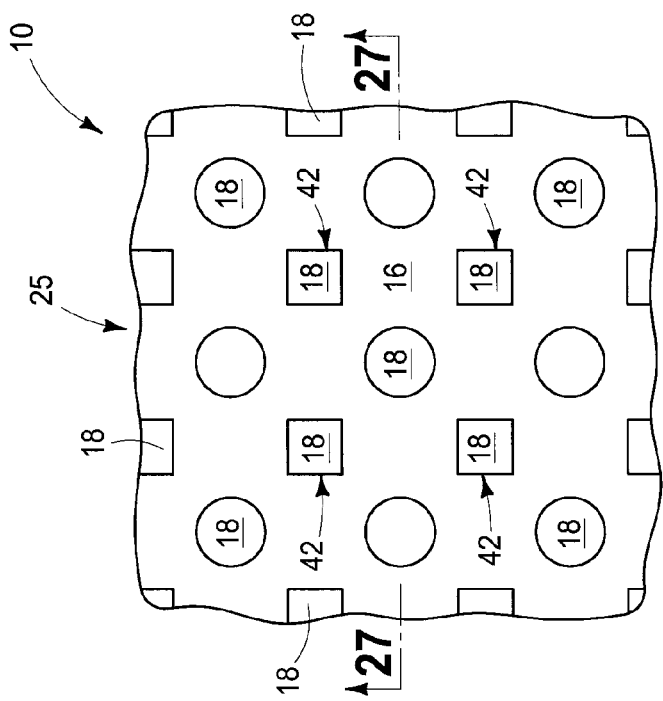
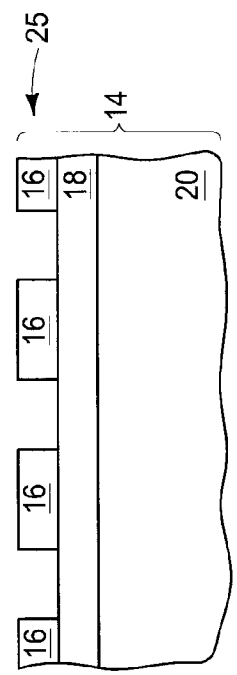

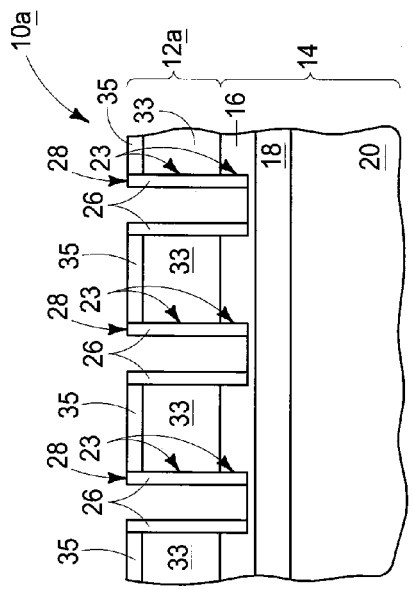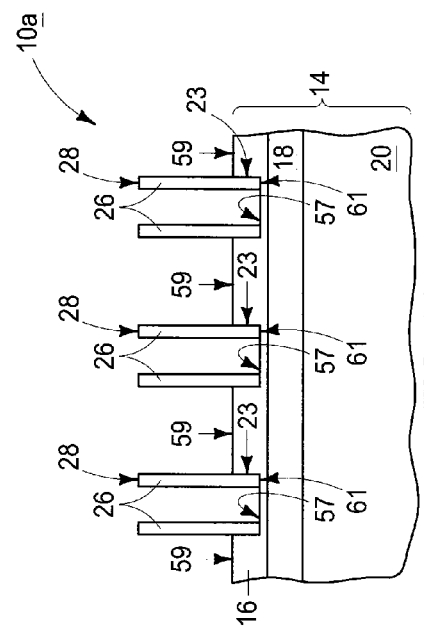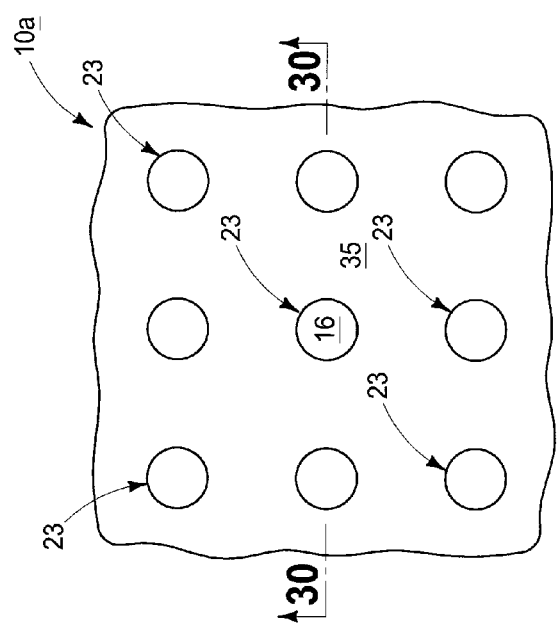

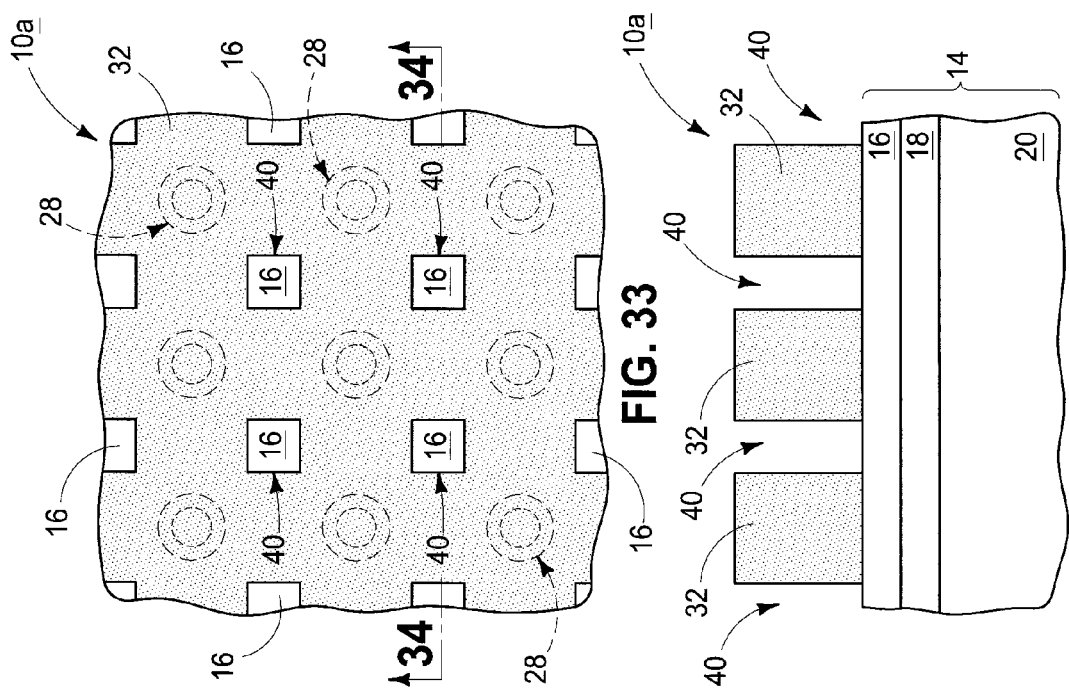
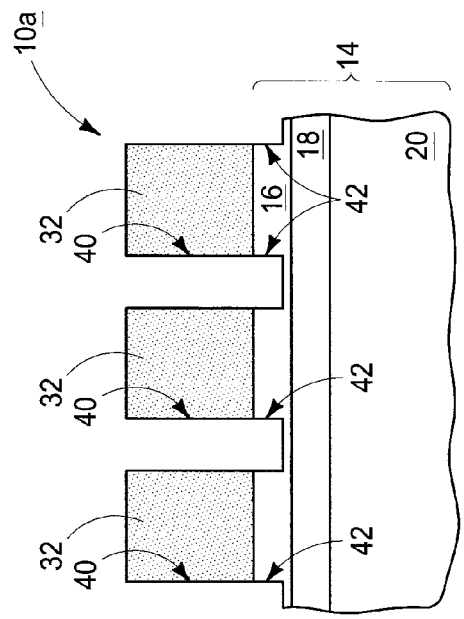

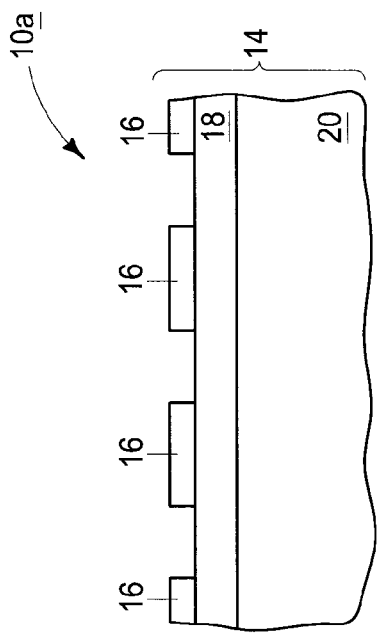
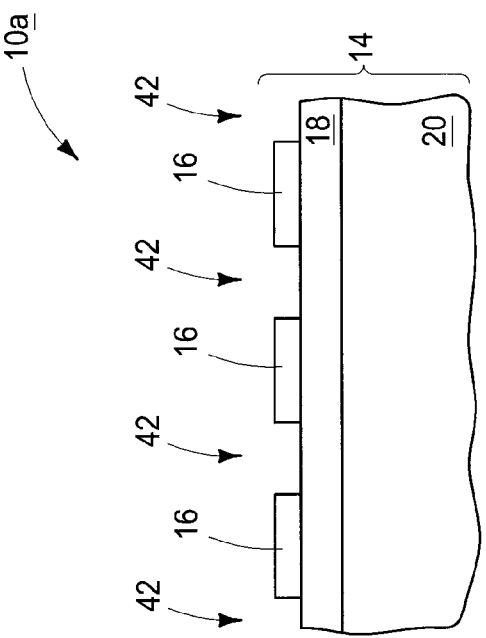
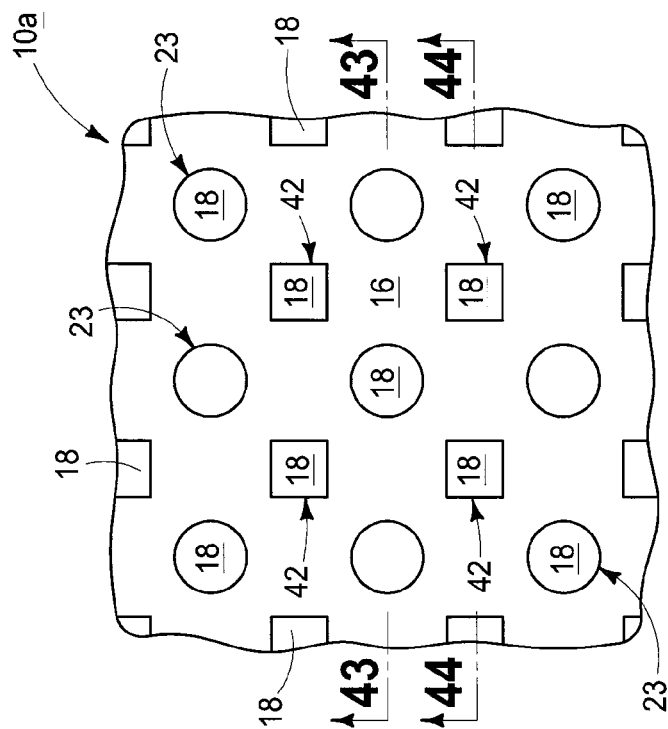

METHODS OF FORMING A PATTERN ON A SUBSTRATE

TECHNICAL FIELD

Embodiments disclosed herein pertain to methods of forming a pattern on a substrate.

BACKGROUND

Integrated circuits are often formed on a semiconductor substrate such as a silicon wafer or other semiconductive material. In general, layers of various materials which are semiconductive, conductive, or electrically insulative are used to form the integrated circuits. By way of examples, the various materials may be doped, ion implanted, deposited, etched, grown, etc. using various processes. A continuing goal in semiconductor processing is to strive to reduce the size of individual electronic components, thereby enabling smaller and denser integrated circuitry.

One technique for patterning and processing semiconductor substrates is photolithography. Such may include deposition of a patternable masking layer commonly known as photoresist. Such materials can be processed to modify their solubility in certain solvents, and are thereby readily usable to form patterns on a substrate. For example, portions of a photoresist layer can be exposed to actinic energy through openings in a radiation-patterning tool, such as a mask or reticle, to change the solvent solubility of the exposed regions versus the unexposed regions compared to the solubility in the as-deposited state. Thereafter, the exposed or unexposed regions can be removed to leave a masking pattern of the photoresist on the substrate. Adjacent areas of the underlying substrate next to the masked portions can be processed, for example by etching or ion implanting, to effect the desired processing of the substrate adjacent the masking material. In certain instances, multiple different layers of photoresist and/or a combination of photoresists with non-radiation sensitive masking materials are used. Further, patterns may be formed on substrates without using photoresist.

The continual reduction in feature sizes places ever greater demands on the techniques used to form those features. For example, photolithography is commonly used to form patterned features such as conductive lines and arrays of contact openings to underlying circuitry. A concept commonly referred to as "pitch" can be used to describe the sizes of the repeating features in conjunction with spaces immediately adjacent thereto. Pitch may be defined as the distance between an identical point in two neighboring features of a repeating pattern in a straight-line cross section, thereby including the maximum width of the feature and the space to the next immediately adjacent feature. However, due to factors such as optics and light or radiation wavelength, photolithography techniques tend to have a minimum pitch below which a particular photolithographic technique cannot reliably form features. Thus, minimum pitch of a photolithographic technique is an obstacle to continued feature size reduction using photolithography.

Pitch doubling or pitch multiplication is one proposed method for extending the capabilities of photolithographic techniques beyond their minimum pitch. Such typically forms features narrower than minimum photolithography resolution by depositing one or more spacer-forming layers to have a total lateral thickness which is less than that of the minimum capable photolithographic feature size. The spacer-forming layers are commonly anisotropically etched to form sub-lithographic features, and then the features which were formed at the minimum photolithographic feature size are etched from the substrate.

Using such techniques where pitch is actually halved, the reduction in pitch is conventionally referred to as pitch "doubling". More generally, "pitch multiplication" encompasses increase in pitch of two or more times, and also of fractional values other than integers. Thus conventionally, "multiplication" of pitch by a certain factor actually involves reducing the pitch by that factor.

In addition to minimum feature size and placement of such features, it is often highly desirable that the features as-formed be uniform in dimension. Accordingly, uniformity when forming a plurality of features may also be of concern, and is increasingly a challenge as the minimum feature dimensions reduce.

BRIEF DESCRIPTION OF THE DRAWINGS

FIG. 1 is a diagrammatic top plan view of a substrate in process in accordance with an embodiment of the invention.

FIG. 2 is a view of the FIG. 1 substrate taken through line 2-2 in FIG. 1.

FIG. 3 is view of the FIG. 1 substrate at a processing step subsequent to that shown by FIG. 1.

FIG. 8 is view of the FIG. 6 substrate at a processing step subsequent to that shown by FIG. 6.

FIG. 9 is a view of the FIG. 8 substrate taken through line 9-9 in FIG. 8.

FIG. 10 is view of the FIG. 8 substrate at a processing step subsequent to that shown by FIG. 8.

FIG. 11 is a view of the FIG. 10 substrate taken through line 11-11 in FIG. 10.

FIG. 12 is view of the FIG. 10 substrate at a processing step subsequent to that shown by FIG. 10.

FIG. 13 is a view of the FIG. 12 substrate taken through line 13-13 in FIG. 12.

FIG. 14 is view of the FIG. 12 substrate at a processing step subsequent to that shown by FIG. 12.

FIG. 15 is a view of the FIG. 14 substrate taken through line 15-15 in FIG. 14.

FIG. 16 is view of the FIG. 14 substrate at a processing step subsequent to that shown by FIG. 14.

FIG. 17 is a view of the FIG. 16 substrate taken through line 17-17 in FIG. 16.

FIG. 18 is a view of the FIG. 16 substrate taken through line 18-18 in FIG. 16.

FIG. 19 is view of the FIG. 16 substrate at a processing step subsequent to that shown by FIG. 16.

FIG. 20 is a view of the FIG. 19 substrate taken through line 20-20 in FIG. 19.

FIG. 21 is view of the FIG. 19 substrate at a processing step subsequent to that shown by FIG. 19.

FIG. 22 is a view of the FIG. 21 substrate taken through line 22-22 in FIG. 21.

FIG. 26 is view of the FIG. 23 substrate at a processing step subsequent to that shown by FIG. 23.

FIG. 27 is a view of the FIG. 26 substrate taken through line 27-27 in FIG. 26.

FIG. 28 is view of the FIG. 26 substrate at a processing step subsequent to that shown by FIG. 26.

FIG. 29 is a diagrammatic top plan view of a substrate in process in accordance with an embodiment of the invention.

FIG. 30 is a view of the FIG. 29 substrate taken through line 30-30 in FIG. 29.

FIG. 31 is view of the FIG. 30 substrate at a processing step subsequent to that shown by FIG. 30.

FIG. 32 is view of the FIG. 31 substrate at a processing step subsequent to that shown by FIG. 31.

FIG. 33 is a diagrammatic top plan view of the FIG. 32 substrate at a processing step subsequent to that shown by FIG. 32.

FIG. 34 is a view of the FIG. 33 substrate taken through line 34-34 in FIG. 33.

FIG. 35 is view of the FIG. 34 substrate at a processing step subsequent to that shown by FIG. 34.

FIG. 42 is view of the FIG. 39 substrate at a processing step subsequent to that shown by FIG. 39.

FIG. 43 is a view of the FIG. 42 substrate taken through line 43-43 in FIG. 42.

FIG. 44 is a view of the FIG. 42 substrate taken through line 44-44 in FIG. 42.

DETAILED DESCRIPTION OF EXAMPLE EMBODIMENTS

Figure 4:
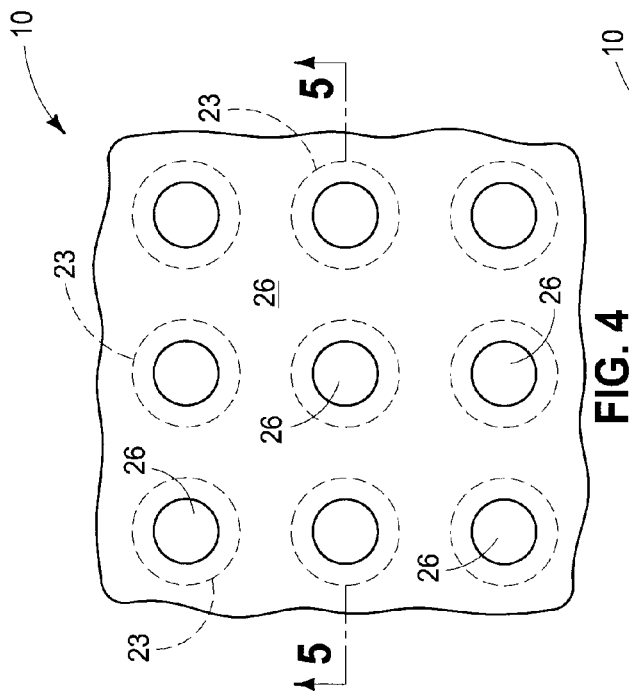
FIG. 4 is view of the FIG. 3 substrate at a processing step subsequent to that shown by FIG. 3.

Example embodiments of methods of forming a pattern on a substrate in accordance with the invention are initially described with reference to FIGS. 1-28. Any method in accordance with the invention may be used in the fabrication of integrated circuitry or for other purposes and whether existing or yet-to-be developed.

Referring to FIGS. 1 and 2, a substrate fragment 10 is shown, and may comprise a semiconductor substrate. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Example substrate 10 comprises a first material 12 that is elevationally over or outward of substrate material 14 (which also may be considered as a base 14). Any of the materials and/or structures described herein may be homogenous or non-homogenous. Further, each may be formed using any suitable or yet-to-be-developed technique (with or without plasma), with atomic layer deposition, chemical vapor deposition, physical vapor deposition, epitaxial growth, diffusion doping, and ion implanting being examples. In one embodiment, substrate material 14 has a planar elevationally outermost surface 15.

First material 12 may comprise a masking material, which may be sacrificial, and with photoresist being but one example. Example substrate material 14 is shown as comprising material 16, 18, and 20. As examples, material 16 may be hard-masking and/or antireflective coating material (e.g., a silicon oxynitride). An example material 18 comprises carbon, for example an elevationally outer portion comprising diamond-like carbon and an elevationally inner portion comprising amorphous hard-mask carbon. Material 20, in one embodiment, may be that portion of substrate fragment 10 in which a pattern may be formed from processing relative to materials 12, 16, and 18. Alternately, a pattern may be formed in accordance with some embodiments of the invention with respect to any of materials 12, 16, and/or 18 independent of subsequent processing, if any, relative to elevationally underlying material 20. Regardless, an example material 20 is doped or undoped silicon dioxide and one or more additional materials may form a part thereof or be there-below.

An array of first openings 22 has been formed in first material 12. In one embodiment, openings 22 extend through first material 12 to substrate material 14. In one embodiment and as shown, openings 22 are formed in a square lattice pattern. Alternately by way of example, the first openings may be in an oblique or other lattice pattern (not shown). Example manners of forming openings 22 include photolithographic patterning and/or etch. Openings 22 may be formed at a minimum photolithographic-capable feature dimension and/or be spaced from immediately adjacent openings by the minimum photolithographic-capable feature dimension. Alternately, openings 22 may be formed at greater than a minimum-photolithographic-capable feature dimension and/or spacing, or may be formed to be sub-resolution (e.g., being sub-lithographic such as being formed using pitch multiplication techniques).

Referring to FIG. 3, former openings 22 (not shown) have been widened to form widened openings 23. Such may be conducted by an isotropic etch which removes material approximately equally from the sides and tops of first material 12. Alternately, chemistry and conditions may be used which tend to etch greater material from the lateral sides of first material 12 than from the tops. Alternately, chemistries and conditions may be used which tend to etch greater material from the tops of first material 12 than from the lateral sides. For example, isotropic etching may be conducted within an inductively coupled reactor. Example etching parameters which will achieve essentially isotropic etching where first material 12 is photoresist and/or other organic-comprising material are pressure from about 2 mTorr to about 50 mTorr, substrate temperature from about 0° C. to about 110° C., source power from about 150 watts to about 500 watts, and bias voltage at less than or equal to about 25 volts. An example etching gas is a combination of $Cl_2$ from about 20 sccm to about 100 sccm and $O_2$ from about 10 sccm to about 50 sccm. Where first material 12 comprises photoresist, such will isotropically etch at a rate from about 0.2 nanometer/second to about 3 nanometers/second. If even more lateral etching is desired in comparison to vertical etching, example parameter ranges in an inductively coupled reactor include pressure from about 2 mTorr to about 20 mTorr, source power from about 150 watts to about 500 watts, bias voltage at less than or equal to about 25 volts, substrate temperature from about 0° C. to about 110° C., $Cl_2$ and/or HBr flow from about 20 sccm to about 100 sccm, $O_2$ flow from about 5 sccm to about 20 sccm, and $CF_4$ flow from about 4 sccm to about 120 sccm. Regardless, widened openings 23 may be considered as comprising sidewalls 24 and floors 25.

Figure 5:
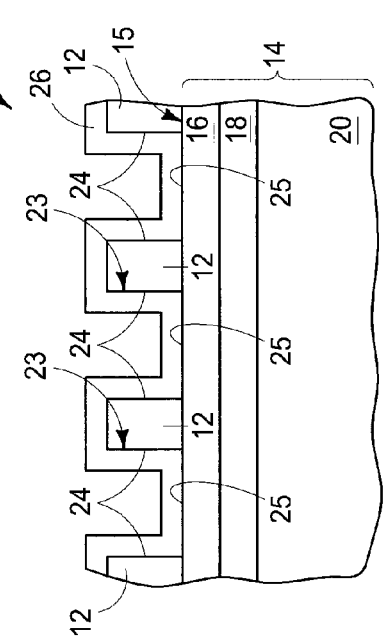
FIG. 5 is a view of the FIG. 4 substrate taken through line 5-5 in FIG. 4.

Referring to FIGS. 4 and 5, a second material 26 has been formed elevationally over first material 12 and to line sidewalls 24 and floors 25 of widened openings 23. In one embodiment, second material 26 is formed to have a lateral thickness which is sub-resolution (i.e., to have a thickness that is less than the minimum feature size fabricated on the substrate fragment solely using photolithographic techniques). Regardless, second material 26 may be of different composition from that of first material 12, with silicon dioxide being an example where first material 12 comprises photoresist. As used herein, "different composition" only requires those portions of two stated materials that may be directly against one another to be chemically and/or physically different, for example if such materials are not homogenous. If the two stated materials are not directly against one another, "different composition" only requires that those portions of the two stated materials that are closest to one another be chemically and/or physically different if such materials are not homogenous. In this document, a material or structure is "directly against" another when there is at least some physical touching contact of the stated materials or structures relative one another. In contrast, "over", "on", and "against" not preceded by "directly", encompass "directly against" as well as construction where intervening material(s) or structure(s) result(s) in no physical touching contact of the stated materials or structures relative one another.

Figure 6:
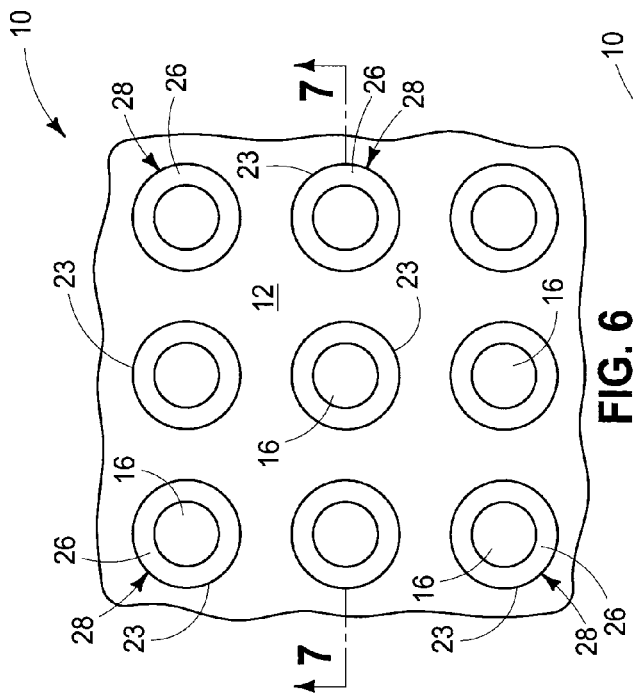
FIG. 6 is view of the FIG. 4 substrate at a processing step subsequent to that shown by FIG. 4.
Figure 7:
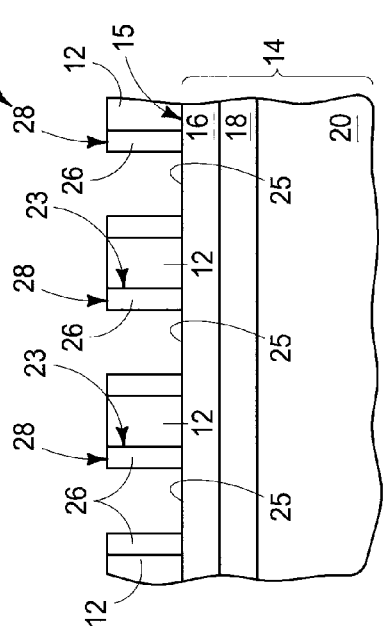
FIG. 7 is a view of the FIG. 6 substrate taken through line 7-7 in FIG. 6.

Referring to FIGS. 6 and 7, second material 26 has been removed back at least to first material 12 to form an upwardly-open cylinder-like structure 28 comprising second material 26 within individual of widened openings 23. In one embodiment, cylinder-like structures 28 are formed by maskless (i.e., no mask being received over material 26 at least within an array area within which openings 23 were formed) anisotropic spacer etching of material 26 and whereby material 26 is also removed centrally from over opening floors 25. Cylinder-like structures 28 may not be circular, nor have an arcuate perimeter (not shown). Cylinder-like structures 28 may have one, more than one, or all straight side segments (not shown). Accordingly, reference to cylinder-like does not require or imply a circular or a rounded perimeter.

The above processing are but example methods of forming spaced upwardly-open cylinder-like structures (e.g., structures 28) projecting longitudinally outward of a base (e.g., material 14). Any other existing or yet-to-be-developed methods may be used. In one embodiment and as shown, cylinder-like structures 28 are in a square lattice pattern. Alternately by way of example, the cylinder-like structures may be in an oblique or other lattice pattern (not shown). In one embodiment and for example as shown, base 14 has an elevationally outermost planar surface 15 atop which cylinder-like structures 28 lie. In one embodiment, cylinder-like structures 28 are formed to be longitudinally longer than widest lateral thickness of their respective walls, for example as shown. Cylinder-like structures 28 may be ring-like, for example not being significantly longitudinally elongated, but nevertheless projecting longitudinally outward of a base (i.e., projecting elevationally outward of the base along their respective longitudinal axes regardless of their longitudinal length).

Referring to FIGS. 8 and 9, base substrate material 14 has been etched into laterally inward of cylinder-like structures 28 using cylinder-like structures 28 and surrounding first material 12 as a first etch mask. In one embodiment and as shown where base substrate material 14 comprises different composition materials 16 and 18, such etching may be conducted completely through material 16 to material 18. Additionally as examples, such etching may also be conducted partially into material 18, or material 16 may not be completely etched through at this point in the process.

Referring to FIGS. 10 and 11, first material 12 (not shown) has been removed selectively relative to cylinder-like structures 28. In this document, a "selective" removal requires removal of one material relative to another stated material at a rate of at least 2:1. An example technique for doing so where second material 26 comprises silicon dioxide and first material 12 comprises photoresist is ashing in an oxygen-containing environment. Base substrate material 14 may be considered as having outermost surfaces 57 (FIG. 11) that are laterally inward of cylinder-like structures 28 and outermost surfaces 59 that are laterally outward of cylinder-like structures 28. In one embodiment and as shown, surfaces 57 are formed by etching base material 14 using cylinder-like structures 28 as a mask. In an embodiment where material 16 is not etched completely through in FIGS. 8 and 9 (not shown), material 16 may remain covering material 18 laterally outward of cylinder-like structures during removal of material 12 in FIGS. 10 and 11 (not shown). This might be desirable where at least the outermost portion of material 18 may be of a composition that is subject to removal (e.g., by etching) when material 12 is removed.

Referring to FIGS. 12 and 13, photoresist 32 has been formed elevationally over and laterally inward of (in other words, within) cylinder-like structures 28, and in one embodiment after removing of first material 12 (for example, removed as shown in FIGS. 10 and 11). Such photoresist is ultimately patterned to form interstitial spaces into the photoresist laterally outward of the cylinder-like structures, with the interstitial spaces being individually surrounded by at least three of the cylinder-like structures. In one embodiment, the patterned photoresist comprises two time-spaced exposure steps using different exposure masks and only one developing step of the photoresist. One example such embodiment is next described with reference to FIGS. 14-20.

Referring to FIGS. 14 and 15, a first of two exposure steps is illustrated wherein exposed regions of photoresist 32 are indicated with stippling and masked/un-exposed portions of photoresist 32 are shown without stippling. In the exposure step of FIGS. 14 and 15, spaced parallel lines 34 of photoresist 32 that pass over immediately adjacent of cylinder-like structures 28 are shown. In the context of this document, "immediately adjacent" with respect to the cylinder-like structures refers to respective pairs of cylinder-like structures that are closest to one another in comparison with all cylinder-like structures that immediately surround the respective pair. For example in a square lattice pattern as shown, the immediately adjacent pairs are those which are along sides of individual squares (i.e., orthogonal with the square lattice) as opposed to diagonally across individual squares. As an alternate example, for an oblique lattice pattern (not shown) the immediately adjacent pairs would be those along the diagonals (e.g., at or closer to) 45°. Regardless, example lines 34 are shown as being straight-linear, although other parallel arrangements may be used. For example, the spaced parallel lines of photoresist may be curvilinear (not shown), include a combination of straight segments which longitudinally angle relative one another (not shown), or include a combination of curved and straight segments (not shown).

Referring to FIGS. 16-18, a second and subsequent of the two exposure steps is shown wherein exposed spaced parallel lines 36 of photoresist 32 pass over immediately adjacent cylinder-like structures 28, and angle relative to spaced parallel lines 34. Ninety degree angling of lines 34 relative to lines 36 is shown, although other non-orthogonal angling may be used. Spaced parallel lines 36 may have any other of the attributes described above with respect to spaced parallel lines 34, such as being straight-linear, curvilinear, a combination of straight and curved segments, etc. Regardless, area of photoresist 32 where spaced parallel lines 34 and 36 do not cross comprise interstitial space areas 38 which are laterally outward of cylinder-like structures 28. In one embodiment, one or both of spaced lines 34, 36 have maximum lateral width substantially equal to maximum diameter to lateral outer surfaces of cylinder-like structures 28.

Referring to FIGS. 19 and 20, the exposed photoresist as shown in FIGS. 16 and 18 has been negative tone-developed to form interstitial spaces 40 through interstitial space areas 38. In one embodiment and as shown, the act of patterning leaves photoresist laterally over each of the surrounding at least three cylinder-like structures 28 (e.g., four being shown) relative interstitial spaces 40. The interstitial spaces might be individually surrounded by more than four (not shown) of the cylinder-like structures (e.g., 5, 6, 7, 8 etc.). In one embodiment, laterally-outermost edges of at least some of the spaced parallel lines in at least one of the exposure steps are misaligned from the laterally outermost edges of at least some of the cylinder-like structures. The negative tone-developing may laterally self-align the misaligned laterally outermost edges of the patterned photoresist to the laterally outermost edges of the cylinder-like structures. FIGS. 14-20, by way of example only, show such an example embodiment. Specifically, laterally-outermost edges of spaced lines 34 in the exposure step of FIGS. 14 and 15 are shown as being downwardly misaligned from the laterally outermost edges of cylinder-like structures 28. Further, in the exposure step of FIGS. 16-18, laterally-outermost edges of spaced lines 36 are shown as being misaligned to the right from the laterally outermost edges of cylinder-like structures 28. The negative tone-developing as shown in FIGS. 19 and 20 has laterally self-aligned the laterally outermost edges of the patterned photoresist to the laterally outermost edges of cylinder-like structures 28, for example by what is commonly referred to as "scumming" or "scum action". For example, during photolithographic develop misaligned edges of the photoresist that extend beyond the outermost edges of the cylinder-like structures may self-align laterally inward to the closest laterally outermost edges of the cylinder-like structures. Further, the misaligned edges of the photoresist that are laterally inward of the outermost edges of the cylinder-like structures may during develop form a protective lateral scum liner that projects laterally to closest laterally outermost edges of the cylinder-like structures. Scum generation during photolithographic processing is described in numerous references, including, for example, U.S. Pat. No. 7,175,944 (Yin) and U.S. Pat. No. 7,820,553 (Chu); and U.S. Patent Publication No. 2008/0254637 (Hanson).

The above described processing with respect to FIGS. 14-20 is but one example embodiment wherein two time-spaced exposure steps using different exposure masks are used, followed by only one developing step of the photoresist. As an alternate example embodiment, the patterned photoresist may be formed using one and only one exposure mask, for example a single exposure mask having openings therethrough corresponding to spaced parallel lines 34 and 36 as shown in FIG. 16. Regardless, in one embodiment and as shown, interstitial spaces 40 are individually of quadrilateral cross-sectional shape. The interstitial spaces may be of other cross sectional shape, for example if surrounded by other than four of the cylinder-like structures (e.g., triangular if surrounded by only three, pentagonal if surrounded by only five, hexagonal if surrounded by only six, etc.).

Referring to FIGS. 21 and 22, patterned photoresist 32 of FIGS. 19 and 20 has been used as a second etch mask while etching interstitial openings 42 into base substrate material 14 while photoresist 32 is laterally inward of (e.g., radially within) cylinder-like structures 28. Additionally as examples, the etching may be conducted to extend interstitial openings 42 partially into material 18, or material 16 may not be completely etched through at this point in the process.

Figure 24:
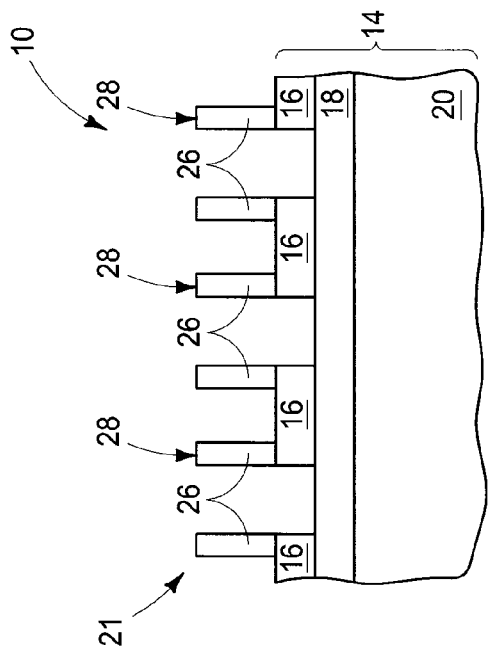
FIG. 24 is a view of the FIG. 23 substrate taken through line 24-24 in FIG. 23.
Figure 25:
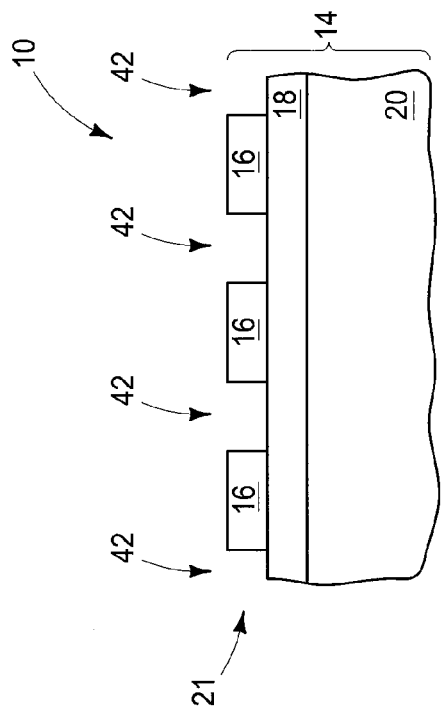
FIG. 25 is a view of the FIG. 23 substrate taken through line 25-25 in FIG. 23.
Figure 23:
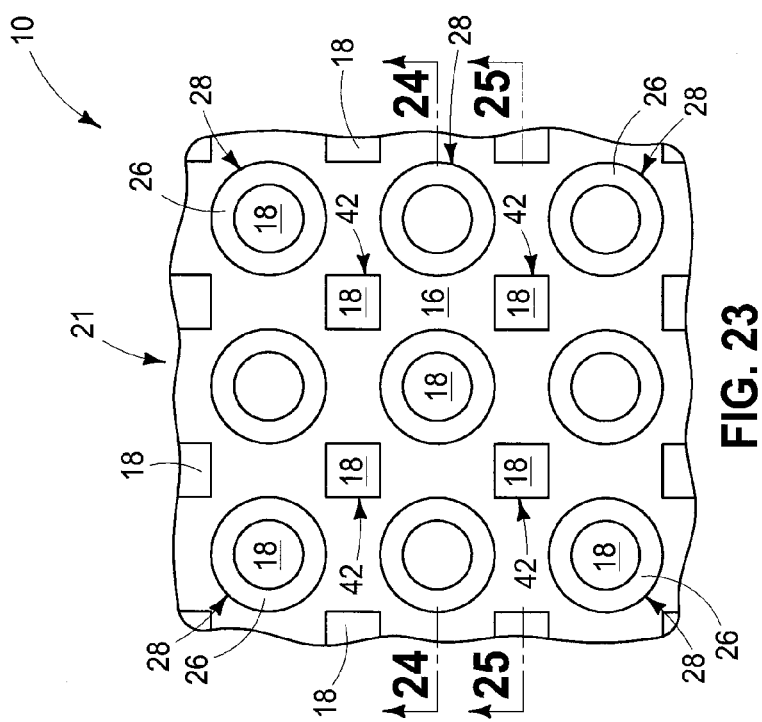
FIG. 23 is view of the FIG. 21 substrate at a processing step subsequent to that shown by FIG. 21.
Figure 37:
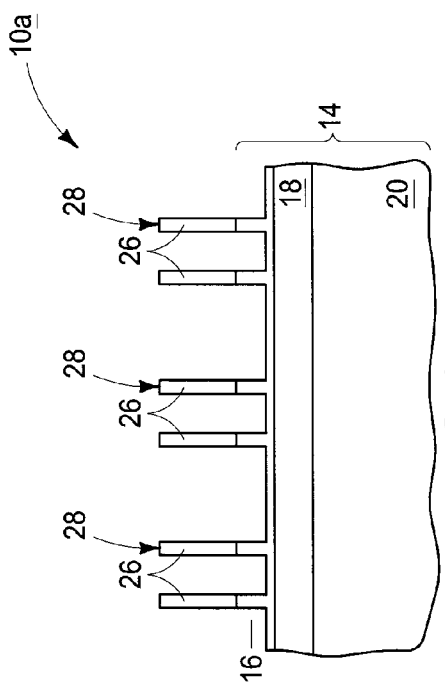
FIG. 37 is a view of the FIG. 36 substrate taken through line 37-37 in FIG. 36.
Figure 38:
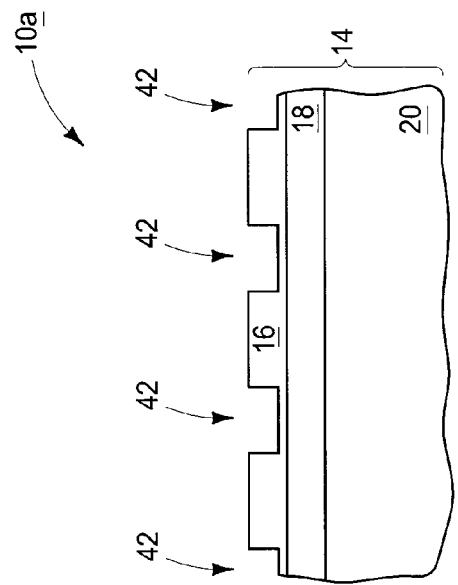
FIG. 38 is a view of the FIG. 36 substrate taken through line 38-38 in FIG. 36.
Figure 36:
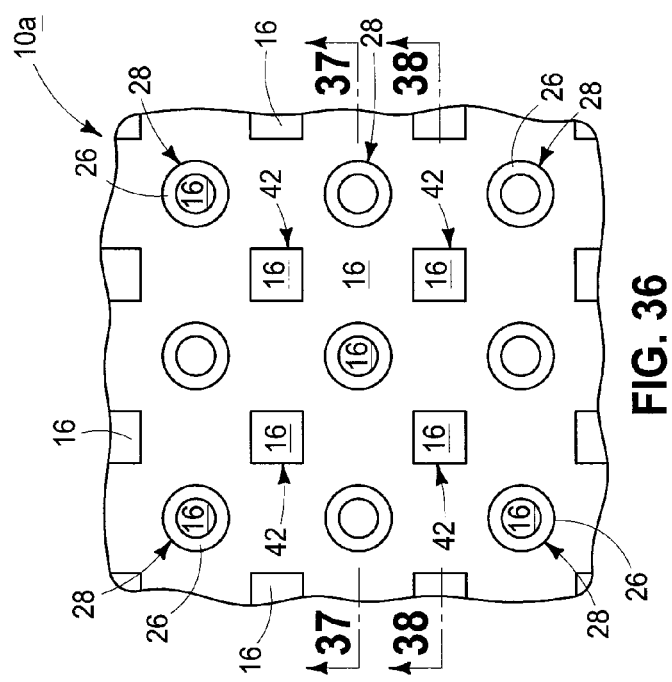
FIG. 36 is a diagrammatic top plan view of the FIG. 35 substrate at a processing step subsequent to that shown by FIG. 35.

Referring to FIGS. 23-25, patterned photoresist 32 (not shown) has been removed from the substrate. In one embodiment and as shown, cylinder-like structures 28 and interstitial openings 42 in combination form an oblique lattice pattern (FIG. 23). In an embodiment where material 16 is not etched completely through in FIGS. 21 and 22 (not shown), material 16 may remain covering material 18 during removal of photoresist 32 in FIGS. 23-25 (not shown). This might be desirable where at least the outermost portion of material 18 may be of a composition that is subject to removal (e.g., by etching) when material 12 is removed.

Referring to FIGS. 26 and 27, cylinder-like structures 28 (not shown) have been removed from the substrate. The processing from FIGS. 21 through 27 may have a tendency to round the corners (not shown) of interstitial openings 42 even to the point of making them individually circular or substantially circular (not shown) as viewed from above.

Referring to FIG. 28, patterned material 16 (not shown) has been used as a mask while etching through material 18 to substrate material 20, with material 16 having been removed during/and or thereafter.

The above shown and described processing are but example methods of forming a pattern on a substrate, for example a pattern 19 as shown in FIGS. 21, 22; a pattern 21 as shown in FIGS. 23-25; a pattern 25 as shown in FIGS. 26, 27; and/or a pattern 27 as shown in FIG. 28. Accordingly, processing in accordance with some embodiments of the invention may be completed at the processing shown by any of FIG. 21, 23, 26, or 28. Alternately or additionally, subsequent processing may occur, for example using pattern 27 of FIG. 28 to process substrate material 20 in the fabrication of integrated circuitry or for other purposes.

Regardless, the above-described processing are but example methods of forming a pattern on a substrate that includes forming photoresist elevationally over and laterally inward of cylinder-like structures. The photoresist is patterned to form interstitial spaces into the photoresist laterally outward of the cylinder-like structures, with the interstitial spaces being individually surrounded by at least three of the cylinder-like structures. The patterned photoresist is used as an etch mask while etching interstitial openings into the substrate and while the photoresist is laterally inward of the cylinder-like structures. Another such example method is described next with respect to a substrate 10a in FIGS. 29-44. Like numerals from the above-described embodiments have been used where appropriate, with some construction differences being indicated with the suffix "a" and/or with different numerals.

Referring to FIGS. 29 and 30, an array of openings 23 has been formed into substrate 10a. Array of openings 23 is shown as a square lattice pattern, although oblique or other lattice patterns may be used. Openings 23 may be formed from narrower or wider initial openings, or otherwise, and may be of any suitable size, shape, and arrangement including those described above with respect to openings 22 and 23 of FIGS. 1-3. Substrate 10a is shown as comprising first material 12a formed over substrate base 14, with substrate base 14 comprising materials 16, 18 and 20. In one embodiment, first material 12a comprises a thicker material 33 of diamond-like and/or amorphous carbon underlying a thinner material 35 of an anti-reflective coating (e.g., silicon oxynitride). In FIGS. 29 and 30, openings 23 extend through first material 12a and into substrate base 14, for example only partially into material 16 as shown.

Referring to FIG. 31, an anisotropically etched sidewall spacer (e.g., structures 28) has been formed over laterally internal sidewalls of individual openings 23. Some or all of material 35 may be removed commensurate with forming structures 28 or before forming material of structures 28.

Referring to FIG. 32 only some of the material into which openings 23 were formed has been removed (e.g., all of first material 12a [not shown] but only some or none of material 16). Such action leaves anisotropically etched sidewall spacers as upwardly-open, cylinder-like structures 28 projecting longitudinally and elevationally outward relative to openings 23 and an elevationally outer surface 59 of remaining material within which openings 23 were formed. The processing described with respect to FIGS. 29-32 is but one example of forming cylinder-like structures within openings (e.g. openings 23) in base substrate 14.

Referring to FIGS. 33 and 34, photoresist 32 has been formed elevationally over and laterally inward of cylinder-like structures 28, and has been patterned to form interstitial spaces 40 therein laterally outward of cylinder-like structures 28. Interstitial spaces 40 are individually surrounded by at least three of cylinder-like structures 28. Any of the processing described and shown above (e.g., with respect to FIGS. 14-20), or otherwise, maybe used in patterning photoresist 32.

Figure 41:
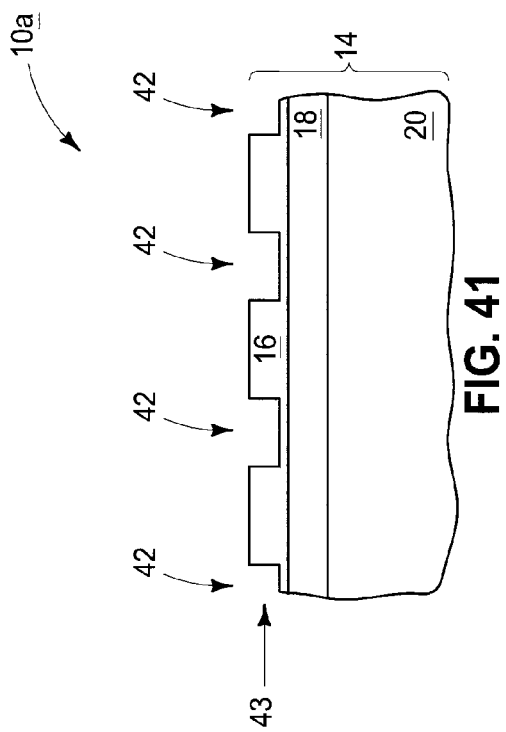
FIG. 41 is a view of the FIG. 39 substrate taken through line 41-41 in FIG. 39.
Figure 39:
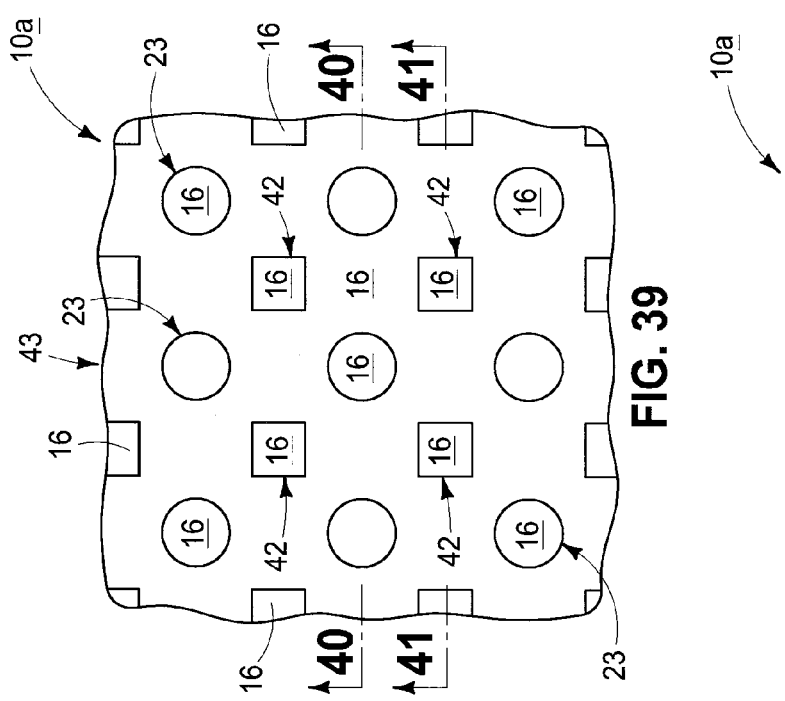
FIG. 39 is view of the FIG. 36 substrate at a processing step subsequent to that shown by FIG. 36.
Figure 40:
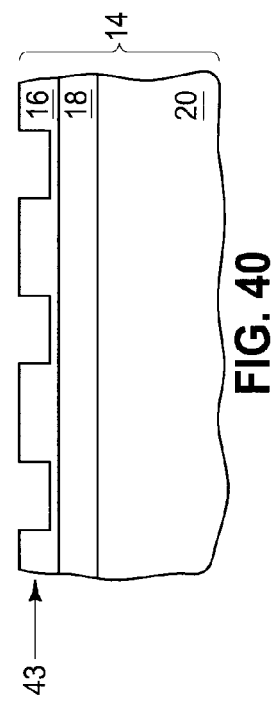
FIG. 40 is a view of the FIG. 39 substrate taken through line 40-40 in FIG. 39.

Referring to FIG. 35, patterned photoresist 32 of FIG. 34 has been used as an etch mask while etching interstitial openings 42 into base substrate 14 while photoresist 32 is laterally inward of cylinder-like structures 28. Photoresist 32 is ultimately removed from the substrate (FIGS. 36-38), as are cylinder-like structures 28 (FIGS. 39-41), thereby forming a pattern 43 (FIGS. 39-41). Like described above, the processing from FIGS. 36 through 41 may have a tendency to round the corners (not shown) of interstitial openings 42 even to the point of making them individually circular or substantially circular (not shown) as viewed from above.

FIGS. 42-44 depict example subsequent processing whereby material 16 of pattern 43 in FIGS. 39-41 has been anisotropically etched partially to at least expose material 18. Remaining material 16 in FIGS. 42-44 may, by way of example, be used as an etch mask or an ion implantation mask in processing substrate material 18 and/or 20 through the depicted openings 42 and 23 in material 16.

The embodiment shown by FIGS. 1-28 etches into base substrate material laterally inward of the cylinder-like structures after their formation and before forming the photoresist. The embodiment shown by FIGS. 29-44 does not. Both the depicted embodiment of FIGS. 1-28 and the depicted embodiment of FIGS. 29-44 show the base substrate material having outermost surfaces that are elevationally recessed laterally inward of the cylinder-like structures compared to laterally outward of the cylinder-like structures prior to forming photoresist 32. For example referring to FIGS. 10 and 11, base substrate 14 has outermost surfaces 57 that are elevationally recessed laterally inward of cylinder-like structures 28 compared to outermost surfaces 59 that are laterally outward of cylinder-like structures 28. Such is also shown in FIG. 32 with respect to surfaces 57 and 59. Yet in the embodiment depicted by FIGS. 29-44, surfaces 57 are formed before forming the cylinder-like structures whereas they are formed thereafter in the embodiment of FIGS. 1-28.

In one embodiment and as shown in FIG. 32, cylinder-like structures 28 lie upon an elevationally outer surface 61 of base substrate 14 that is elevationally coincident with base elevationally outermost surfaces 57 that are laterally inward of the cylinder-like structures. In another embodiment as shown in FIGS. 10 and 11, cylinder-like structures 28 lie upon a surface 61 of base substrate 14 that is not elevationally coincident with base elevationally outermost surfaces 57.

An embodiment of the invention includes a method of forming a pattern on a substrate which comprises forming spaced, first material-comprising, upwardly-open, cylinder-like structures that project elevationally outward of second material. The second material is of different composition from that of the first material. Third material is elevationally inward of the second material and is of different composition from that of the second material. Each of the embodiments of FIG. 1-28 and FIG. 29-44 may have such attributes wherein material of cylinder-like structures 28 is considered as a first material which is of different composition from that of material 16 which may be considered as the second material, and with material 16 being of different composition from that of material 18 which is considered as a third material.

Photoresist is formed elevationally over and laterally inward of the cylinder-like structures. It is patterned to form interstitial spaces therein laterally outward of the cylinder-like structures, with the interstitial spaces being individually surrounded by at least three of the cylinder-like structures. Then, the photoresist and cylinder-like structures are removed from the substrate. In the embodiment depicted by FIGS. 8 and 9, the interstitial openings are etched through the second material (e.g., material 16) to the third material (e.g., material 18) prior to removing the photoresist and the cylinder-like structures from the substrate. In one embodiment and as shown in FIG. 35, the interstitial openings are etched only partially into the second material (e.g., material 16) prior to removing the photoresist and the cylinder-like structures from the substrate.

In one embodiment, the cylinder-like structures lie atop a planar outermost surface of the second material (e.g., FIGS. 6 and 7), and the second material (e.g., material 16) is etched through to the third material (e.g., material 18) laterally inward of the cylinder-like structures prior to forming the photoresist (e.g., as occurs in FIGS. 8 and 9 before forming photoresist 32 in FIGS. 12 and 13). In one embodiment, the interstitial openings are etched through the second material to the third material prior to removing the photoresist and the cylinder-like structures from the substrate, for example as shown in FIGS. 21 and 22.

CONCLUSION

In some embodiments, a method of forming a pattern on a substrate comprises forming spaced, upwardly-open, cylinder-like structures projecting longitudinally outward of a base. Photoresist is formed elevationally over and laterally inward of the cylinder-like structures. The photoresist is patterned to form interstitial spaces into the photoresist laterally outward of the cylinder-like structures. The interstitial spaces are individually surrounded by at least three of the cylinder-like structures. The patterned photoresist is used as an etch mask while etching interstitial openings into the base and while the photoresist is laterally inward of the cylinder-like structures.

In some embodiments, a method of forming a pattern on a substrate comprises forming spaced first material-comprising upwardly-open, cylinder-like structures projecting elevationally outward of second material. The second material is of different composition from that of the first material. Third material is elevationally inward of the second material and is of different composition from that of the second material. Photoresist is formed elevationally over and laterally inward of the cylinder-like structures. The photoresist is patterned to form interstitial spaces into the photoresist laterally outward of the cylinder-like structures. The interstitial spaces are individually surrounded by at least three of the cylinder-like structures. The patterned photoresist is used as an etch mask while etching interstitial openings into the second material and while the photoresist is laterally inward of the cylinder-like structures. After etching the interstitial openings, the photoresist and the cylinder-like structures are removed from the substrate.

In some embodiments, a method of forming a pattern on a substrate comprises forming an array of first openings in first material that is elevationally outward of substrate material. After forming the first openings, the first openings are widened. Second material is formed elevationally over the first material and to line sidewalls and floors of the widened openings. The second material is of different composition from that of the first material. The second material is removed back at least to the first material to form an upwardly-open cylinder-like structure comprising the second material within individual of the widened openings. The substrate material laterally inward of the cylinder-like structures is etched into using the cylinder-like structures and surrounding first material as a first etch mask. Thereafter, the first material is removed selectively relative to the cylinder-like structures. Photoresist is formed elevationally over and laterally inward of the cylinder-like structures after the removing of the first material. The photoresist is patterned to form interstitial spaces into the photoresist laterally outward of the cylinder-like structures. The interstitial spaces are individually surrounded by photoresist and at least three of the cylinder-like structures. The patterned photoresist is used as a second etch mask while etching interstitial openings into the substrate material and while the photoresist is laterally inward of the cylinder-like structures. Thereafter, the photoresist and the cylinder-like structures are removed from the substrate.

In some embodiments, a method of forming a pattern on a substrate comprises forming an array of first openings into a substrate. An anisotropically etched sidewall spacer is formed over laterally internal sidewalls of individual of the first openings. Only some of the material into which the first openings were formed is removed to leave the anisotropically etched sidewall spacers as upwardly-open, cylinder-like structures projecting longitudinally and elevationally outward relative to the first openings and an elevationally outer surface of remaining of the material into which the first openings were formed. Photoresist is formed elevationally over and laterally inward of the cylinder-like structures. The photoresist is patterned to form interstitial spaces into the photoresist laterally outward of the cylinder-like structures. The interstitial spaces are individually surrounded by photoresist and at least three of the cylinder-like structures. The patterned photoresist is used as an etch mask while etching interstitial openings into the substrate while the photoresist is laterally inward of the cylinder-like structures. Thereafter, the photoresist and the cylinder-like structures are removed from the substrate.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method of forming a pattern on a substrate, comprising:
    forming spaced, upwardly-open, cylinder-like structures projecting longitudinally outward of a base;
    forming photoresist elevationally over and laterally inward of the cylinder-like structures;
    patterning the photoresist to form interstitial spaces into the photoresist laterally outward of the cylinder-like structures, the interstitial spaces being individually surrounded by at least three of the cylinder-like structures, the patterning leaving photoresist covering elevationally over all tops and covering laterally over all sidewalls of the cylinder-like structures; and
    using the patterned photoresist as an etch mask while etching interstitial openings into the base and while the photoresist is laterally inward of the cylinder-like structures and while the photoresist is covering elevationally over all the tops and covering laterally over all the sidewalls of the cylinder-like structures.

2. The method of claim 1 wherein the photoresist patterning comprises use of one and only one exposure mask.

3. The method of claim 1 comprising, after forming the cylinder-like structures, etching into the base laterally inward of the cylinder-like structures before forming the photoresist.

4. The method of claim 1 wherein the cylinder-like structures are formed within openings in the base.

5. The method of claim 1 wherein, prior to forming the photoresist, the base has an elevationally outermost planar surface atop which the cylinder-like structures lie.

6. The method of claim 1 wherein forming the cylinder-like structures comprises maskless anisotropic spacer-etching of material of which the cylinder-like structures are formed.

7. The method of claim 1 comprising forming the cylinder-like structures to be longitudinally longer than widest lateral thickness of their walls.

8. The method of claim 1 wherein the interstitial spaces are individually of quadrilateral cross-sectional shape.

9. The method of claim 1 comprising using the pattern in the fabrication of integrated circuitry.

10. The method of claim 1 wherein the interstitial spaces are individually surrounded by at least four of the cylinder-like structures.

11. The method of claim 10 wherein the interstitial spaces are individually surrounded by only four of the cylinder-like structures.

12. A method of forming a pattern on a substrate, comprising:
    forming spaced, upwardly-open, cylinder-like structures projecting longitudinally outward of a base;
    forming photoresist elevationally over and laterally inward of the cylinder-like structures;
    patterning the photoresist to form interstitial spaces into the photoresist laterally outward of the cylinder-like structures, the interstitial spaces being individually surrounded by at least three of the cylinder-like structures;
    using the patterned photoresist as an etch mask while etching interstitial openings into the base and while the photoresist is laterally inward of the cylinder-like structures; and
    the photoresist patterning comprising:

two time-spaced exposure steps using different exposure masks; and only one developing step of the photoresist; and individual of the two exposure steps comprising exposing spaced parallel lines of the photoresist that pass over immediately adjacent of the cylinder-like structures, the spaced parallel lines of the different exposure masks angling relative one another, area of the photoresist where the spaced parallel lines from the two exposure steps do not cross comprising interstitial space areas; and the one developing step comprising negative tone-developing to form the interstitial spaces through the interstitial space areas.

13. The method of claim 12 wherein the spaced lines have maximum lateral width substantially equal to maximum diameter to the lateral outer surfaces of the cylinder-like structures, laterally-outermost edges of at least some of the spaced lines in at least one of the exposure steps being misaligned from laterally outermost edges of at least some of the cylinder-like structures, the negative tone-developing laterally self-aligning the misaligned laterally outermost edges of the patterned photoresist to the laterally outermost edges of the cylinder-like structures.

14. A method of forming a pattern on a substrate, comprising:

forming spaced, upwardly-open, cylinder-like structures projecting longitudinally outward of a base;

forming photoresist elevationally over and laterally inward of the cylinder-like structures;

patterning the photoresist to form interstitial spaces into the photoresist laterally outward of the cylinder-like structures, the interstitial spaces being individually surrounded by at least three of the cylinder-like structures;

using the patterned photoresist as an etch mask while etching interstitial openings into the base and while the photoresist is laterally inward of the cylinder-like structures; and wherein, prior to and during the forming of the photoresist, the base has outermost surfaces that are elevationally recessed laterally inward of the cylinder-like structures compared to laterally outward of the cylinder-like structures.

15. The method of claim 14 wherein the elevationally outermost surfaces of the base that are laterally inward of the cylinder-like structures are formed after forming the cylinder-like structures.

16. The method of claim 15 wherein the elevationally outermost surfaces of the base that are laterally inward of the cylinder-like structures are formed by etching the base using the cylinder-like structures as a mask.

17. The method of claim 16 wherein the cylinder-like structures lie upon elevationally outer surfaces of the base that are not elevationally coincident with the elevationally outermost surfaces of the base that are laterally inward of the cylinder-like structures.

18. The method of claim 14 wherein the elevationally outermost surfaces of the base that are laterally inward of the cylinder-like structures are formed before forming the cylinder-like structures.

19. The method of claim 18 wherein the cylinder-like structures lie upon elevationally outer surfaces of the base that are elevationally coincident with the elevationally outermost surfaces of the base that are laterally inward of the cylinder-like structures.

20. A method of forming a pattern on a substrate, comprising:

forming spaced, upwardly-open, cylinder-like structures projecting longitudinally outward of a base;

forming photoresist elevationally over and laterally inward of the cylinder-like structures;

patterning the photoresist to form interstitial spaces into the photoresist laterally outward of the cylinder-like structures, the interstitial spaces being individually surrounded by at least three of the cylinder-like structures;

using the patterned photoresist as an etch mask while etching interstitial openings into the base and while the photoresist is laterally inward of the cylinder-like structures; and the cylinder-like structures being in a square lattice pattern, and further comprising:

removing the patterned photoresist from the base after the etching, the removing of the patterned photoresist forming an elevationally outermost pattern on the substrate that is an oblique lattice pattern comprised of the cylinder-like structures and interstitial openings in combination.

21. A method of forming a pattern on a substrate, comprising:

forming spaced, upwardly-open, cylinder-like structures projecting longitudinally outward of a base;

forming photoresist elevationally over and laterally inward of the cylinder-like structures;

patterning the photoresist to form interstitial spaces into the photoresist laterally outward of the cylinder-like structures, the interstitial spaces being individually surrounded by at least three of the cylinder-like structures;

using the patterned photoresist as an etch mask while etching interstitial openings into the base and while the photoresist is laterally inward of the cylinder-like structures; and the base comprises an elevationally outermost material of different composition from that of elevationally innermost material of the cylinder-like structures, the cylinder-like structures extending elevationally into the elevationally outermost material during the forming of the photoresist, during the patterning of the photoresist, and during the etching.

22. A method of forming a pattern on a substrate, comprising:

forming spaced first material-comprising, upwardly-open, cylinder-like structures projecting elevationally outward of second material; the second material being of different composition from that of the first material; third material elevationally inward of the second material and being of different composition from that of the second material;

forming photoresist elevationally over and laterally inward of the cylinder-like structures;

patterning the photoresist to form interstitial spaces into the photoresist laterally outward of the cylinder-like structures, the interstitial spaces being individually surrounded by at least three of the cylinder-like structures;

using the patterned photoresist as an etch mask while etching interstitial openings into the second material and while the photoresist is laterally inward of the cylinder-like structures; and after etching the interstitial openings, removing the photoresist and the cylinder-like structures from the substrate.

23. The method of claim 22 wherein the interstitial openings are etched through the second material to the third material prior to removing the photoresist and the cylinder-like structures from the substrate.

24. The method of claim 22 wherein the interstitial openings are etched only partially into the second material prior to removing the photoresist and the cylinder-like structures from the substrate.

25. The method of claim 22 wherein the cylinder-like structures lie atop a planar outermost surface of the second material, and further comprising etching through the second material to the third material laterally inward of the cylinder-like structures prior to forming the photoresist.

26. The method of claim 25 wherein the interstitial openings are etched through the second material to the third material prior to removing the photoresist and the cylinder-like structures from the substrate.

27. A method of forming a pattern on a substrate, comprising:
    forming spaced, upwardly-open, cylinder-like structures projecting longitudinally outward of a base;
    forming photoresist elevationally over and laterally inward of the cylinder-like structures;
    patterning the photoresist to form interstitial spaces into the photoresist laterally outward of the cylinder-like structures, the interstitial spaces being individually surrounded by at least three of the cylinder-like structures, the interstitial spaces individually being laterally centered among the cylinder-like structures that surround the respective individual interstitial space, the patterning leaving photoresist covering elevationally over all tops and covering laterally over all sidewalls of the cylinder-like structures; and
    using the patterned photoresist as an etch mask while etching interstitial openings into the base and while the photoresist is laterally inward of the cylinder-like structures and while the photoresist is covering elevationally over all the tops and covering laterally over all the sidewalls of the cylinder-like structures.

\* \* \* \* \*

UNITED STATES PATENT AND TRADEMARK OFFICE
CERTIFICATE OF CORRECTION

Page 1 of 1

PATENT NO.        : 8,937,018 B2
APPLICATION NO.   : 13/786848
DATED             : January 20, 2015
INVENTOR(S)       : Vishal Sipani et al.

It is certified that error appears in the above-identified patent and that said Letters Patent is hereby corrected as shown below:

Title Page, Item (72), in column 1, in "Inventors", lines 1-2, delete "Anton J. deVillers," and insert -- Anton J. deVilliers, --, therefor.

Signed and Sealed this
Eighteenth Day of August, 2015

Michelle K. Lee
*Director of the United States Patent and Trademark Office*